(12) United States Patent
Nakamura

(10) Patent No.: US 11,415,525 B2
(45) Date of Patent: Aug. 16, 2022

(54) CARRIER LIFESPAN MEASUREMENT METHOD AND CARRIER LIFESPAN MEASUREMENT DEVICE

(71) Applicant: HAMAMATSU PHOTONICS K.K., Hamamatsu (JP)

(72) Inventor: Tomonori Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 127 days.

(21) Appl. No.: 16/969,210

(22) PCT Filed: Jan. 17, 2019

(86) PCT No.: PCT/JP2019/001341
§ 371 (c)(1),
(2) Date: Aug. 12, 2020

(87) PCT Pub. No.: WO2019/159595
PCT Pub. Date: Aug. 22, 2019

(65) Prior Publication Data
US 2020/0408701 A1 Dec. 31, 2020

(30) Foreign Application Priority Data
Feb. 16, 2018 (JP) .............................. JP2018-025799

(51) Int. Cl.
*G01N 21/95* (2006.01)
*G01R 31/26* (2020.01)
(52) U.S. Cl.
CPC ..... *G01N 21/9501* (2013.01); *G01R 31/2642* (2013.01)

(58) Field of Classification Search
CPC ... G01N 2021/1719; G01N 2021/1725; G01N 21/1717; G01N 21/9501; G01R 31/2642; Y02E 10/50; H02S 50/10
(Continued)

(56) References Cited

U.S. PATENT DOCUMENTS

2004/0196464 A1 10/2004 Akutsu et al.

FOREIGN PATENT DOCUMENTS

JP 2004-311580 A 11/2004
JP 2009-521796 A 6/2009
(Continued)

OTHER PUBLICATIONS

International Preliminary Report on Patentability dated Aug. 27, 2020 for PCT/JP2019/001341.

*Primary Examiner* — Tri T Ton
(74) *Attorney, Agent, or Firm* — Faegre Drinker Biddle & Reath LLP

(57) ABSTRACT

A carrier lifetime measurement method for measuring a lifetime of carriers in a measurement target object includes an irradiation step of irradiating a DUT 10 serving as a measurement target object with measurement light and stimulus light subjected to intensity modulation using a plurality of frequencies, an outputting step of outputting a detection signal by detecting an intensity of reflected light from the DUT 10 or transmitted light through the DUT 10, and a generation step of detecting a phase delay of the detection signal with respect to a modulation signal including a frequency in association with a concentration of impurities in a measurement target region of the plurality of frequencies and generating image data indicating a distribution of lifetimes of carriers in the DUT 10 on the basis of the phase delay.

12 Claims, 6 Drawing Sheets

(58) Field of Classification Search
USPC .......................................... 356/356, 300–334
See application file for complete search history.

(56) References Cited

FOREIGN PATENT DOCUMENTS

| | | |
|---|---|---|
| JP | 2016-157780 A | 9/2016 |
| RU | 2444085 C1 | 2/2012 |
| TW | 273042 | 3/1996 |
| TW | 201250230 A | 12/2012 |
| WO | WO-2007/050570 A2 | 5/2007 |
| WO | WO 2013/016469 A1 | 1/2013 |
| WO | WO-2013/161860 A1 | 10/2013 |

(a)

(b)

(c)

(d)

(a)

(b)

CARRIER LIFESPAN MEASUREMENT METHOD AND CARRIER LIFESPAN MEASUREMENT DEVICE

TECHNICAL FIELD

The present disclosure relates to a carrier lifetime measurement method and a carrier lifetime measurement device for measuring a lifetime of carriers in a measurement target object.

BACKGROUND ART

In the related art, a device for performing characteristic evaluation of a measurement target object such as a solar battery is known (for example, refer to the following Patent Literature 1). This device is configured to have a pumping light source irradiating a measurement target object with pulsed pumping light, a probe light source continuously irradiating the measurement target object with probe light, a photo detector detecting the probe light used for irradiating the measurement target object in real time, and a signal processing unit processing a signal output from the photodetector. According to such a configuration, it is possible to measure circumstances of generation and extinction of carriers by measuring a change in carrier quantity over time.

CITATION LIST

Patent Literature

[Patent Literature 1] Japanese Unexamined Patent Publication No. 2016-157780

SUMMARY OF INVENTION

Technical Problem

In such devices in the related art described above, although a change in carrier quantity over time can be measured, it is difficult to measure an exact lifetime of carriers targeting a measurement target object whose concentration of impurities is unknown.

An embodiment aims to provide a carrier lifetime measurement method and a carrier lifetime measurement device capable of accurately measuring a lifetime of carriers in a measurement target object.

Solution to Problem

According to an aspect of the present invention, there is provided a carrier lifetime measurement method for measuring a lifetime of carriers in a measurement target object. The carrier lifetime measurement method includes an irradiation step of irradiating the measurement target object with measurement light and stimulus light subjected to intensity modulation using a plurality of frequencies, an outputting step of outputting a detection signal by detecting an intensity of reflected light from the measurement target object or transmitted light through the measurement target object, and a generation step of detecting a phase delay of the detection signal with respect to a modulation signal including a frequency in association with a concentration of impurities in a measurement target region of the plurality of frequencies and generating image data indicating a distribution of lifetimes of carriers in the measurement target object on the basis of the phase delay.

Alternatively, according to another aspect of the present invention, there is provided a carrier lifetime measurement device for measuring a lifetime of carriers in a measurement target object. The carrier lifetime measurement device includes a first light source configured to generate measurement light, a second light source configured to generate stimulus light, a modulation unit configured to perform intensity modulation of the stimulus light using a plurality of frequencies, a photo detector configured to output a detection signal by detecting an intensity of reflected light from the measurement target object or transmitted light through the measurement target object, an optical system configured to guide the measurement light and the stimulus light subjected to intensity modulation toward the measurement target object and to guide reflected light from the measurement target object or transmitted light through the measurement target object toward the photo detector, and an analysis unit configured detect a phase delay of the detection signal with respect to a modulation signal including a frequency in association with a concentration of impurities in a measurement target region of the plurality of frequencies, and to generate image data indicating a distribution of lifetimes of carriers in the measurement target object on the basis of the phase delay.

According to any of the foregoing aspects, a measurement target object is irradiated with measurement light and stimulus light subjected to intensity modulation using a plurality of frequencies, and an intensity of reflected light from the measurement target object or transmitted light through the measurement target object is detected. As a result, image data indicating a distribution of lifetimes of carriers is generated on the basis of an output detection signal. At this time, a phase delay of a detection signal with respect to a modulation signal including a frequency in association with a concentration of impurities in a measurement target region is detected, and a distribution of lifetimes of carriers is measured on the basis of the phase delay. In this manner, even when a concentration of impurities in a measurement target region changes in a variety of ways, it is possible to accurately measure a distribution of lifetimes of carriers.

Advantageous Effects of Invention

According to an embodiment, it is possible to accurately measure a lifetime of carriers in a measurement target object.

DESCRIPTION OF EMBODIMENT

Hereinafter, an embodiment of the present invention will be described in detail with reference to the accompanying drawings. In the description, the same reference signs are applied to the same elements or elements having the same function, and duplicate description will be omitted.

Figure 1:
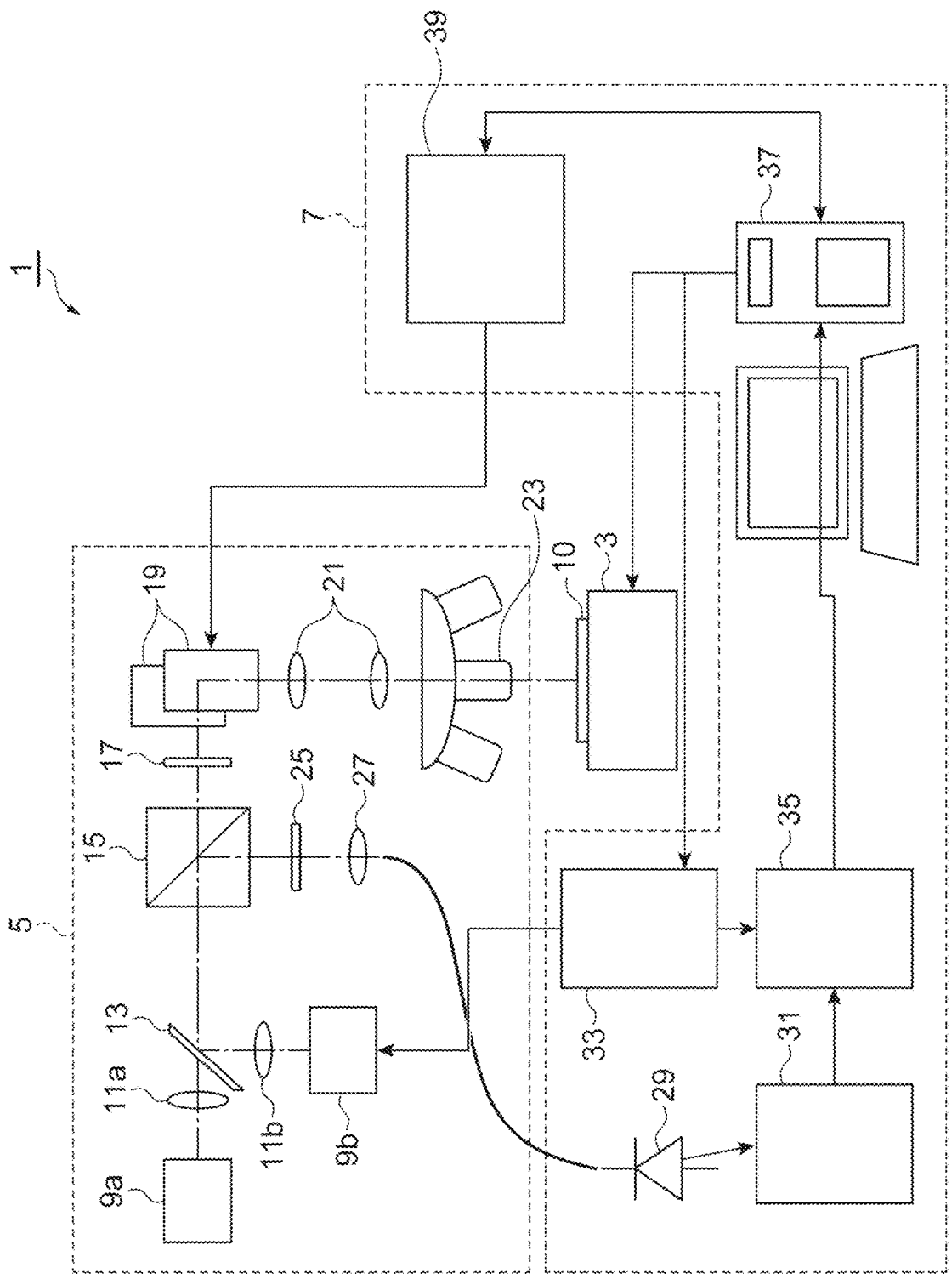
FIG. 1 is a view of a schematic configuration of a carrier lifetime measurement device 1 according to an embodiment.

FIG. 1 is a view of a schematic configuration of a carrier lifetime measurement device 1 according to the embodiment. The carrier lifetime measurement device 1 shown in FIG. 1 is a device for measuring a lifetime of carriers in a device under test (DUT) 10 serving as a measurement target object such as a semiconductor device by performing optical measurement targeting the DUT 10. Regarding a measurement target of the carrier lifetime measurement device 1, a semiconductor device in which a circuit element such as a transistor is formed on a semiconductor substrate is favorably used. More favorably, a region which is estimated to include a defective part using a default defect analyzing method (an analyzing method such as light emission analysis, heat generation analysis, or optical beam induced resistance change (OBIRCH) analysis) in advance may be adopted as a measurement target.

This carrier lifetime measurement device 1 is configured to include a stage 3 on which the DUT 10 is disposed; a light irradiation/light guiding system (optical system) 5 which guides light toward the DUT 10, irradiates the DUT 10 with the light, and guides reflected light from the DUT 10; and a control system 7 which controls the light irradiation/light guiding system 5, detects reflected light from the DUT 10, and performs processing of the reflected light. The stage 3 is a support unit supporting the DUT 10 so that the DUT 10 faces the light irradiation/light guiding system 5. The stage 3 may be equipped with a movement mechanism which can move the DUT 10 relatively to the light irradiation/light guiding system 5. In FIG. 1, a traveling path of light is indicated by a dashed-dotted line, and a transmission path of a control signal and transmission paths of a detection signal and processing data are indicated by solid arrows.

The light irradiation/light guiding system 5 includes a light source (first light source) 9a, a light source (second light source) 9b, collimators 11a and 11b, a dichroic mirror 13, a polarization beam splitter 15, a quarter-wavelength plate 17, a galvanometer mirror 19, a pupil projection lens 21, an object lens 23, an optical filter 25, and a collimator 27.

The light source 9a generates and emits light as measurement light (probe light) that has a wavelength and an intensity suitable for detecting optical characteristics which change in association with the concentration of impurities in the DUT 10. The light source 9b generates and emits light as stimulus light (pumping light) that includes a wavelength component which is partially absorbed in the DUT 10. Specifically, the light source 9b is set to generate stimulus light including a wavelength associated with an energy higher than a band-gap energy of a semiconductor which is a material for a substrate configuring the DUT 10. Moreover, this light source 9b is configured to be able to generate stimulus light subjected to intensity modulation on the basis of an electrical signal from the outside. For example, the light source 9a and the light source 9b may be coherent light sources such as semiconductor lasers or may be incoherent light sources such as super luminescent diodes (SLDs).

The collimators 11a and 11b respectively collimate rays of light emitted from the light sources 9a and 9b, and the dichroic mirror 13 coaxially synthesizes measurement light and stimulus light which have been collimated and outputs the coaxially synthesized light toward the polarization beam splitter 15. The polarization beam splitter 15 allows linearly polarized components of measurement light and stimulus light which have been synthesized to be transmitted therethrough, and the quarter-wavelength plate 17 changes polarization states of the measurement light and the stimulus light which have been transmitted through the polarization beam splitter 15 and sets the polarization states of the measurement light and the stimulus light in circular polarization. The galvanometer mirror 19 performs scanning with measurement light and stimulus light in circular polarization and outputs the measurement light and the stimulus light, and the pupil projection lens 21 relays pupils of measurement light and stimulus light output from the galvanometer mirror 19 to a pupil of the object lens 23 from the galvanometer mirror 19. The object lens 23 collects measurement light and stimulus light on the DUT 10. According to such a configuration, a desired position on the DUT 10 can be scanned and irradiated with measurement light and stimulus light which have been synthesized. In addition, the carrier lifetime measurement device 1 may be configured to be able to perform scanning with measurement light and stimulus light targeting a range which the galvanometer mirror 19 cannot cover by moving the stage 3.

In addition, in the light irradiation/light guiding system 5 having the foregoing configuration, reflected light from the DUT 10 can be guided to the quarter-wavelength plate 17 in a manner of being coaxial with measurement light and stimulus light, and the polarization state of reflected light can be changed from circular polarization to linear polarization by the quarter-wavelength plate 17. Moreover, linearly polarized reflected light is reflected toward the optical filter 25 and the collimator 27 by the polarization beam splitter 15. The optical filter 25 is configured to allow only the same wavelength component as that of measurement light of reflected light to be transmitted therethrough toward the collimator 27 and to block the same wavelength component as that of stimulus light of reflected light. The collimator 27 collimates reflected light and outputs the reflected light toward the control system 7 via an optical fiber or the like.

The control system 7 includes a photo detector 29, an amplifier 31, a modulation signal source (modulation unit) 33, a network analyzer 35 (analysis unit), a controller (analysis unit) 37, and a laser scanning controller 39.

The photo detector 29 is a photo detection element such as a photodiode (PD), an avalanche photodiode (APD), or a photomultiplier tube, which receives reflected light guided by the light irradiation/light guiding system 5, detects the intensity of the reflected light, and outputs a detection signal. The amplifier 31 amplifies a detection signal output from the photo detector 29 and outputs an amplified result to the network analyzer 35. The modulation signal source 33 generates an electrical signal (modulation signal) having a waveform set by the controller 37 and controls the light source 9b so that stimulus light is subjected to intensity modulation on the basis of the electrical signal. Specifically, the modulation signal source 33 generates an electrical signal having rectangular waves of a set repetition frequency (default frequency) and controls the light source 9b on the basis of the electrical signal. In addition, the modulation signal source 33 also has a function of repetitively generating an electrical signal having rectangular waves of a plurality of repetition frequencies. Stimulus light subjected to intensity modulation due to each of rectangular waves of repetition frequencies includes components of a plurality of frequencies including the repetition frequencies and frequencies having higher harmonic waves thereof.

The network analyzer 35 extracts and detects a detection signal having a wavelength component associated with the repetition frequency on the basis of a detection signal output from the amplifier 31 and the repetition frequency set by the modulation signal source 33. Specifically, the network analyzer 35 extracts a detection signal having the same frequency as the repetition frequency and a detection signal having a frequency of higher harmonic waves thereof. Moreover, the network analyzer 35 detects a phase delay of a detection signal having each of the frequencies with respect to stimulus light subjected to intensity modulation on the basis of an electrical signal generated by the modulation signal source 33. Further, the network analyzer 35 inputs information of each of the frequencies of the extracted detection signals and information of a detected phase delay targeting the detection signal to the controller 37 in an associated manner. At this time, the network analyzer 35 may repetitively extract a detection signal targeting an electrical signal having a plurality of repetition frequencies which have been repetitively set by the controller 37 and may detect a phase delay targeting the detection signal. For example, a phase delay may be detected by changing the repetition frequency from a fundamental frequency to frequencies of $\frac{1}{10}$ times, ten times, and the like. Here, the network analyzer 35 may be changed to a spectrum analyzer, may be changed to a lock-in amplifier, or may be changed to a configuration in which a digitizer and an FFT analyzer are combined.

Figure 2:
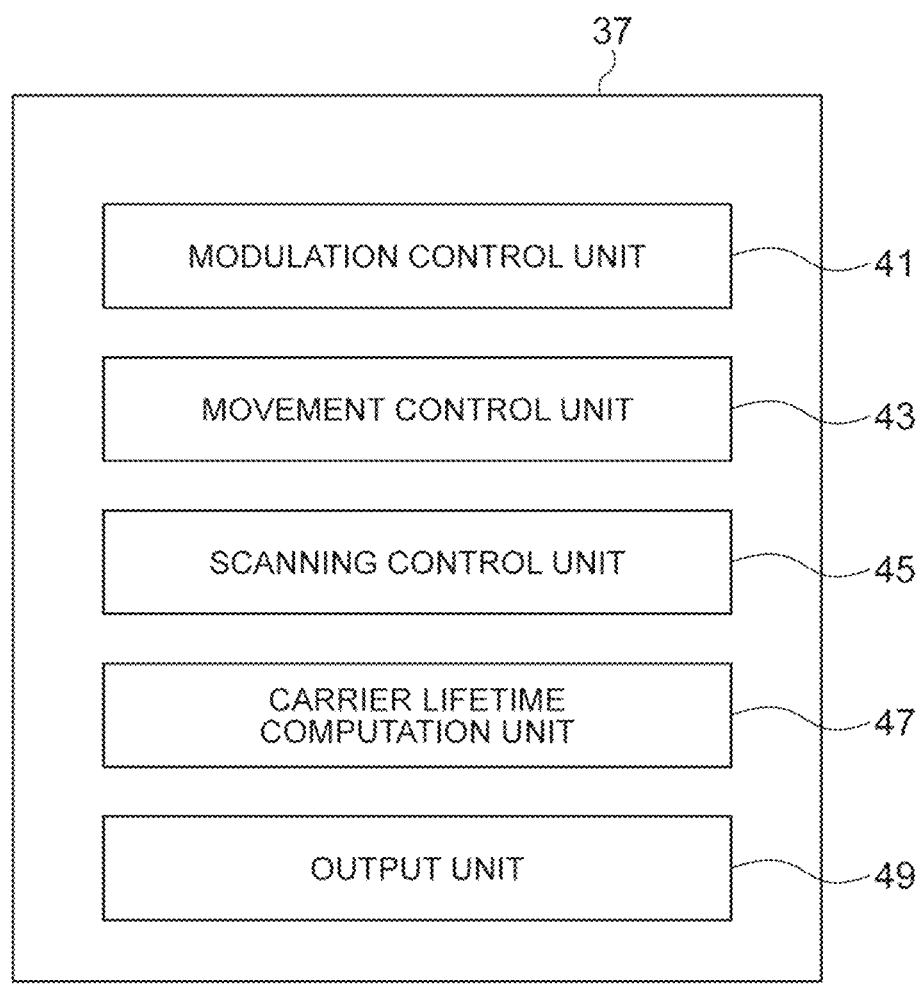
FIG. 2 is a block diagram showing a configuration of functions of a controller 37 in FIG. 1.

The controller 37 is a device for generally controlling operation of the control system 7 and is physically a control device such as a computer including a central processing unit (CPU) serving as a processor, a random access memory (RAM) and a read only memory (ROM) serving as recording mediums, a communication module, and input/output devices such as a display, a mouse, a keyboard, and the like. FIG. 2 shows a configuration of functions of the controller 37. As shown in FIG. 2, as functional constituent elements, the controller 37 is configured to include a modulation control unit 41, a movement control unit 43, a scanning control unit 45, a carrier lifetime computation unit 47, and an output unit 49.

The modulation control unit 41 of the controller 37 sets a waveform of an electrical signal for performing intensity modulation of stimulus light. Specifically, the modulation control unit 41 sets a waveform of an electrical signal to have rectangular waves of a predetermined repetition frequency. This "predetermined repetition frequency" may be a frequency having a value stored in the controller 37 in advance in accordance with a concentration of impurities or the like in a postulated DUT 10 or may be a frequency having a value input from the outside via the input/output device. In addition, the modulation control unit 41 may repetitively change the repetition frequency from a fundamental frequency which has been recorded or input in advance to a plurality of frequencies and may be able to set an electrical signal in accordance with the changed repetition frequencies.

The movement control unit 43 and the scanning control unit 45 respectively control the stage 3 and the galvanometer mirror 19 to perform scanning with measurement light and stimulus light on the DUT 10. At this time, the movement control unit 43 performs control so that scanning is performed with measurement light and stimulus light while carrier lifetime computation processing (which will be described below) is performed targeting each of the places in the DUT 10.

The carrier lifetime computation unit 47 computes a lifetime of carriers targeting each of the places in a measurement target region of the DUT 10 on the basis of information of the phase delay for each of the frequencies of the detection signals output from the network analyzer 35 and executes carrier lifetime computation processing (details of carrier lifetime computation processing will be described below) for generating image data indicating a distribution of lifetimes of carriers within the measurement target region. The output unit 49 outputs image data generated by the carrier lifetime computation unit 47 to the input/output device as an image.

Figure 3:
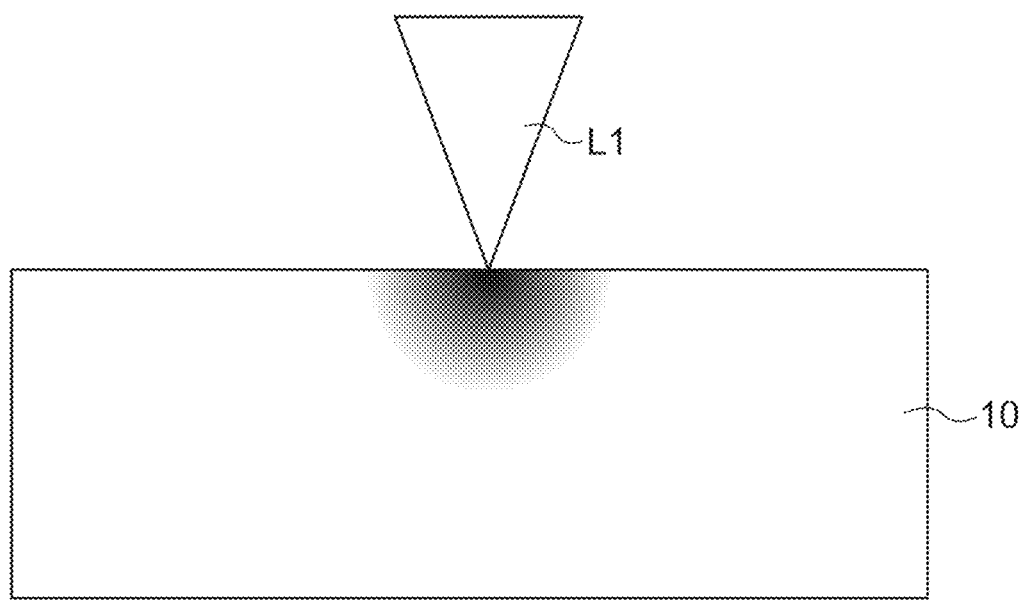
FIG. 3 is a view of an irradiation state of measurement light and stimulus light in a DUT 10 viewed in a direction perpendicular to optical axes of the measurement light and the stimulus light.
Figure 4:
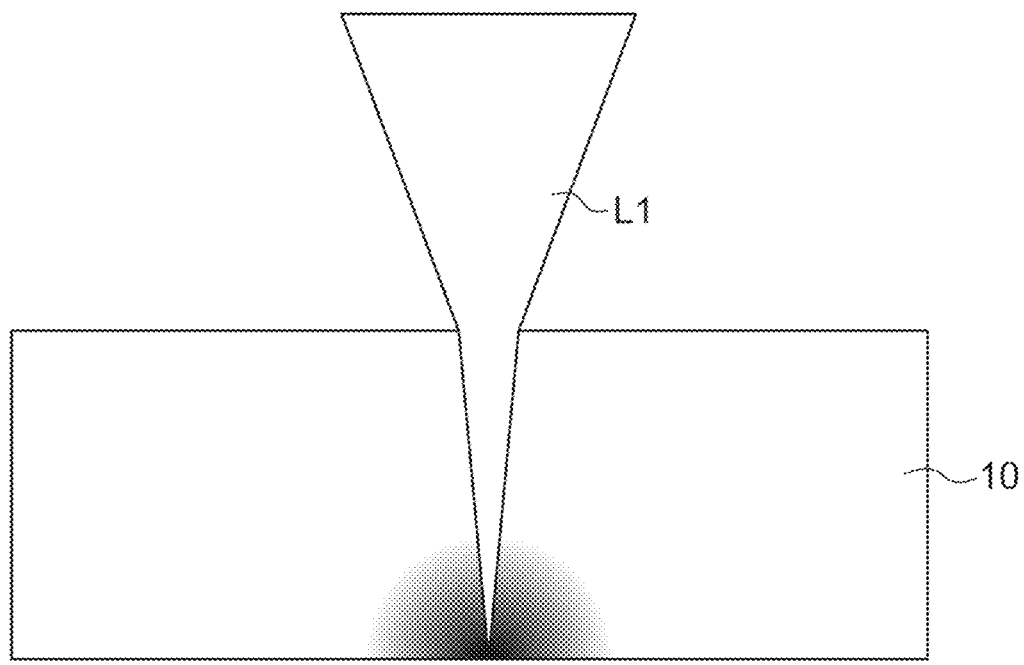
FIG. 4 is a view of another irradiation state of measurement light and stimulus light in the DUT 10 viewed in a direction perpendicular to the optical axes of the measurement light and the stimulus light.

A phenomenon measured by the carrier lifetime measurement device 1 having the foregoing configuration will be described. FIGS. 3 and 4 are views of irradiation states of measurement light and stimulus light in the DUT 10 viewed in a direction perpendicular to optical axes of the measurement light and the stimulus light.

Due to the light irradiation/light guiding system 5, stimulus light, which includes a wavelength associated with an energy higher than a band-gap energy, is subjected to intensity modulation and the stimulus light is irradiated the DUT 10 with. At the same time, irradiation is performed with measurement light having a different wavelength at a uniform intensity. At this time, carriers are generated inside the DUT 10 due to the stimulus light, and these carriers become extinct due to recombination at a speed depending on the concentration of impurities and the concentration of defects inside the DUT 10 at a timing when the intensity of the stimulus light is weakened.

A refraction index and a transmission factor inside the DUT 10 are influenced by the carrier density inside the substrate of the DUT 10. Due to this influence, the measurement light is modulated depending on the modulation state of the stimulus light when the measurement light is reflected on the front surface of the substrate or the rear surface of the substrate. The state of modulation of measurement light varies in accordance with the recombination speed of carriers. That is, recombination occurs at a high speed in a region in which the concentration inside the substrate is high, and recombination occurs at a low speed in a region in which the concentration is low. As a result, regarding reflected light generated due to reflection of measurement light, the amplitude increases when recombination occurs at a high speed. On the other hand, the amplitude decreases when recombination occurs at a low speed and the phase is delayed with respect to stimulus light at the same time.

FIG. 3 shows a state in which the front surface of the substrate of the DUT 10 on the light irradiation/light guiding system 5 side is set to be irradiated with synthetic light L1 of measurement light and stimulus light. In this case, the stimulus light generates plenty of electron-positive hole pairs in the vicinity of the front surface of the substrate. When the DUT 10 is a semiconductor substrate, the DUT 10 has a concentration of impurities to a certain degree. Therefore, a majority of carriers (electrons in a case of an n-type substrate and positive holes in a case of a p-type substrate) are present in a uniform quantity in accordance with this concentration of impurities, and a minority carriers (positive holes in a case of an n-type substrate and electrons in a case of a p-type substrate) are also present. When stimulus light is incident in this state, the refraction index of the substrate changes due to the carriers, which are present excessively in the incidence region. It is known that a reflection factor R between atmospheric air and a substrate is expressed by the following expression $R=((n-1)/(n+1))^2$ when the refraction index of atmospheric air is "1" and the refraction index of the substrate is n. The reflection factor R also changes as the refraction index n changes due to generation and extinction of carriers, and thus reflected light is modulated.

Meanwhile, FIG. 4 shows a state in which the rear surface of the substrate of the DUT 10 on a side opposite to the light irradiation/light guiding system 5 is set to be irradiated with the synthetic light L1 of measurement light and stimulus light in a manner of being transmitted therethrough. In this case, reflected light also receives the influence of carriers in an optical path in addition to the influence of carriers on the reflection surface in the case of the FIG. 3. Specifically, an effect of attenuation of light occurs in addition to a change in refraction index due to the carriers in the optical path, and therefore the reflected light is influenced by both. An excessively minority carriers become extinct at a speed proportional to the product of the density of a majority carriers, that is, the concentration of impurities in the substrate and the density of an excessively minority carriers (more strictly speaking, an excessively minority carriers is reduced at a speed proportional to the difference with respect to the product of the excess part and a majority carriers). As a result, when stimulus light decreases, the refraction index returns to the original state at a speed proportional to the concentration of impurities in the substrate. However, this change in refraction index is considerably smaller than the extent of the refraction index of the substrate itself.

When the reflected light in the case shown in FIG. 3 or 4 is observed, the intensity of the reflected light changes substantially in association with a change in refraction index, and a time constant of a change in reflected light with respect to a change in stimulus light is inversely proportional to the concentration of impurities in the substrate.

Figure 5:
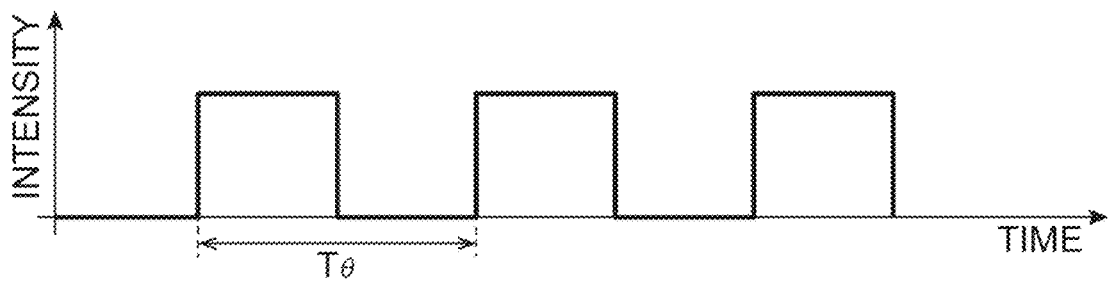
FIG. 5 is a view showing waveforms of changes in stimulus light and detection signal over time generated by the carrier lifetime measurement device 1.
Figure 5:
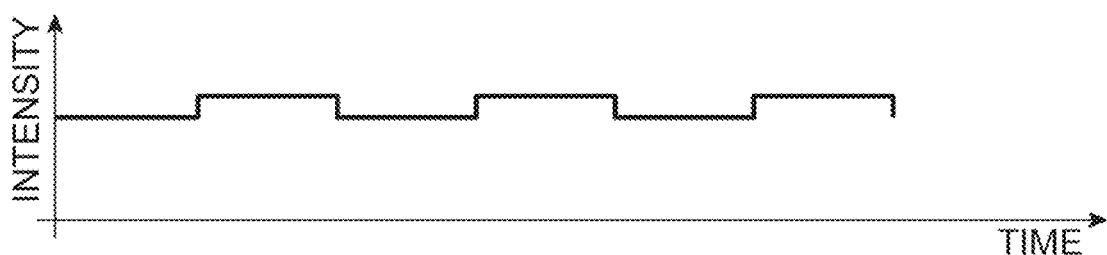
Figure 5:
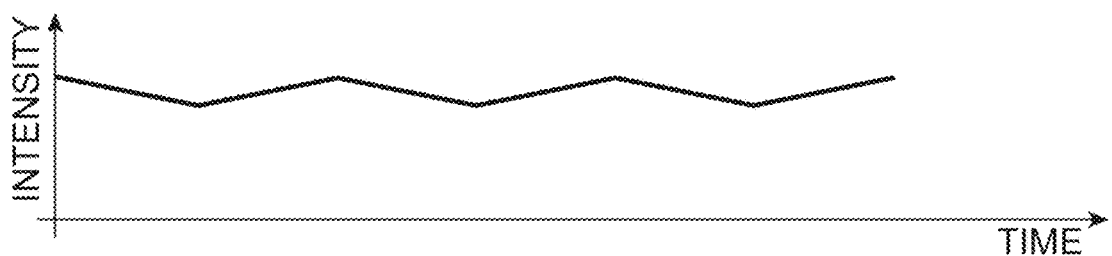
Figure 5:
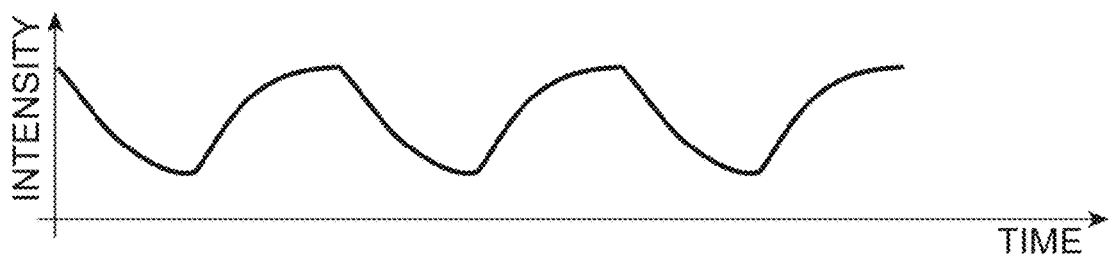

In FIG. 5, the part (a) shows a waveform of a change in stimulus light used for irradiation of the carrier lifetime measurement device 1 over time, and the parts (b) to (d) show waveforms of changes in detection signal detected by the carrier lifetime measurement device 1 over time with respect to stimulus light having the waveform shown in the part (a). When a repetition cycle $T_0$ of the stimulus light is considerably larger than the time constant of a change in reflected light (the repetition frequency is low), the sensitivity of the phase delay observed in the detection signal becomes low as shown in the part (b). When the time constant of a change in reflected light is approximately half the repetition cycle $T_0$ of the stimulus light (when the time constant is comparatively large and the phase delay is approximately 90 degrees), a phase delay appears in a change in amplitude of the detection signal as shown in the part (c). A phase delay appears most notably in a change in amplitude of the detection signal when the time constant of a change in reflected light is approximately ¼ (when the phase delay is 45 degrees) of the repetition cycle $T_0$ of the stimulus light as shown in the part (d).

In the present embodiment, a lifetime from generation to extinction of carriers generated due to incident stimulus light is measured by detecting a phase delay of reflected light with respect to stimulus light in frequencies associated with the concentration of impurities in the measurement target region inside the DUT 10. Here, since rectangular waves also include not only a component of the repetition frequency but also a frequency component having higher harmonic waves thereof, the lifetime of carriers can be measured efficiently.

Moreover, even when the concentration inside the DUT 10 is uncertain, a lifetime of carriers can be measured by repetitively changing the repetition frequency and detecting the detection signal.

Hereinafter, details of a measurement procedure including the carrier lifetime computation processing in the carrier lifetime measurement device 1 will be described.

First, in a case of the DUT 10 being a semiconductor device in which abnormal operation is caused, a measurement target region including a defective part is identified using a default defect analyzing method (an analyzing method such as light emission analysis, heat generation analysis, or OBIRCH analysis) in advance, and the measurement target region is set in the controller 37 as a scanning target for the movement control unit 43 and the scanning control unit 45 (identifying step).

Next, the DUT 10 is placed on the stage 3. For example, when the DUT 10 is a semiconductor device in which a circuit element is formed, the DUT 10 is placed so that it can be irradiated with measurement light and stimulus light from the rear surface side of the substrate. When the DUT 10 is irradiated from the rear surface side, the rear surface may be polished as necessary, and a solid immersion lens may be used.

Thereafter, the DUT 10 is irradiated with measurement light and stimulus light from the light irradiation/light guiding system 5 (irradiation step). At this time, the optical axes and the focal depths of the measurement light and the stimulus light are set in advance so that they become the same, and the light irradiation/light guiding system 5 is configured to be an optical system having a sufficiently small chromatic aberration. At this time, the rear surface of the DUT 10 is subjected to angular adjustment to be perpendicular to the optical axes of the measurement light and the stimulus light, and the focal points of the measurement light and the stimulus light are also set to be focused on a measurement surface of the DUT 10.

Moreover, due to control of the controller 37, control is performed so that stimulus light is subjected to intensity modulation due to rectangular waves. The repetition frequency of these rectangular waves is set in advance in accordance with a postulated concentration of impurities. For example, the frequency is set to approximately 1 MHz if the measurement target region is a well part around a transistor, and the frequency is set to several tens of MHz if the measurement target region is a source region or a drain region of a transistor. The repetition frequency is set in proportional to the postulated concentration with respect to the concentrations of impurities having other values.

Next, in the photo detector 29 of the control system 7, reflected light from the measurement surface of the DUT 10 is detected, a detection signal is generated, and the detection signal is amplified by the amplifier 31 (outputting step). Further, the component of the repetition frequency and the component of the higher harmonic waves thereof are extracted from the detection signal by the network analyzer 35 of the control system 7. At this time, a band width is set to avoid ground noise of 0 Hz.

In addition, in the network analyzer 35 of the control system 7, a phase delay with respect to the modulation signal of stimulus light is detected targeting the waveforms of the extracted detection signals having a plurality of frequencies (generation step). Moreover, association data in which information of each of the frequencies of the extracted detection signals and information of a detected phase delay targeting the detection signal are associated with each other is output to the controller 37 from the network analyzer 35 (generation step).

Detection of the phase delay of the detection signals having the foregoing plurality of frequencies and outputting of association data related thereto may be performed repetitively targeting the plurality of repetition frequencies which have been repetitively set. Consequently, the lifetime of carriers can be measured even when the concentration of impurities or the like is uncertain. In addition, detection of the phase delay of the detection signals having the foregoing plurality of frequencies and outputting the association data related thereto are performed repetitively while measurement points on the DUT 10 are scanned within the measurement target region due to control of the controller 37.

Thereafter, the lifetimes of carriers at a plurality of measurement points are computed by the controller 37 using the association data related to the plurality of measurement points within the measurement target region on the DUT 10 (generation step, carrier lifetime computation processing). That is, a frequency at which the phase delay is close to a predetermined value (for example, 45 degrees) is extracted on the basis of the association data, and a combination of the frequency and the phase delay is identified. Accordingly, the phase delays detected in the frequencies associated with the concentrations of impurities at the measurement points are identified. For example, this predetermined value is set to 45 degrees, at which the phase delay is most likely to appear in a change in amplitude of the detection signal, but is not limited thereto. Further, the lifetimes of carriers at the measurement points on the DUT 10 are computed on the basis of the frequency and the phase delay. At this time, when a frequency having a phase delay close to a predetermined phase delay cannot be extracted, processing of detecting reflected light may be performed repetitively by further changing the repetition frequency.

More specifically, the lifetime of carriers is computed as follows. A frequency at which the phase delay becomes 45 degrees is referred to as a cutoff frequency, and a time constant $\tau$ at this time becomes $1/(2\pi)$ times of a cycle associated with this frequency. This time constant $\tau$ corresponds to a lifetime of carriers inside the DUT 10. Utilizing this property, a lifetime LT of carriers is computed using the following expression $LT=\tan \Delta\theta/(2\pi F)$ on the basis of a frequency F and a phase delay $\Delta\theta$ extracted from association data.

Lastly, values of the lifetimes of carriers computed regarding a plurality of measurement points are mapped on an image by the controller 37, data of an output image indicating the distribution of lifetimes of carriers on the DUT 10 is generated (generation step). Further, the output image is output to the input/output device on the basis of the data. With this output image, a fine distribution of lifetimes of carriers on the DUT 10 can be observed within a high-dynamic range in a non-contact manner. For example, unevenness of the lifetime of carriers can be easily observed. As a result, an abnormal place in a circuit element such as a transistor on the DUT 10 can be easily identified.

Figure 6:
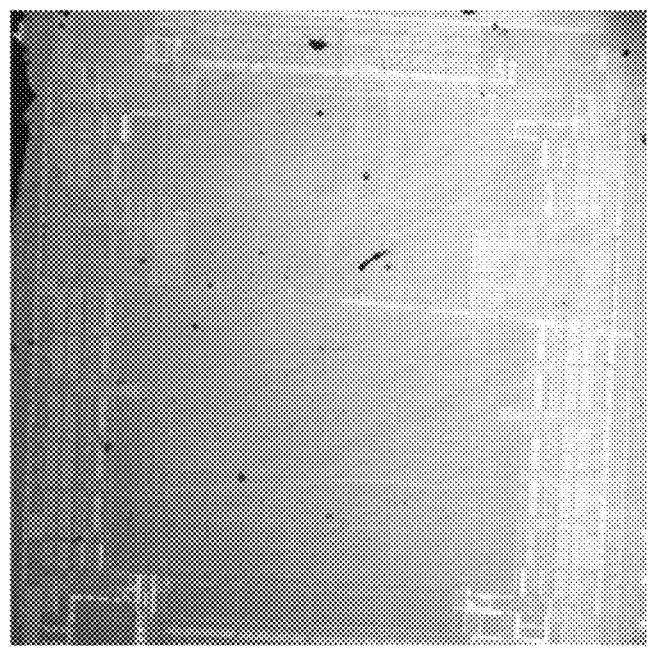
FIG. 6(a) is a view showing a pattern image in which an image of an external appearance of a measurement target region of the DUT 10 is captured.
FIG. 6(b) is a view showing an output image of a distribution of lifetimes of carriers output by the carrier lifetime measurement device 1 targeting the measurement target region shown in FIG. 6(a).
Figure 6:
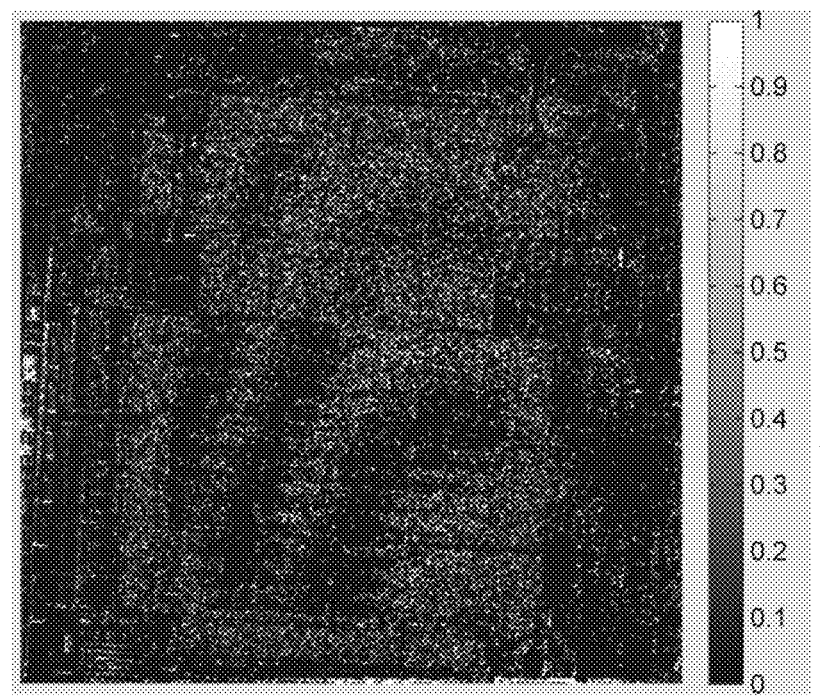

The part (a) of FIG. 6 shows a pattern image in which an image of an external appearance of a measurement target region of the DUT 10 is captured, and the part (b) of FIG. 6 shows an output image of a distribution of lifetimes of carriers output by the carrier lifetime measurement device 1 targeting the measurement target region shown in the part (a). In this manner, in an output image, a distribution of lifetimes of carriers is expressed by the gradation of pixels.

According to the carrier lifetime measurement device 1 described above and a carrier lifetime measurement method using the carrier lifetime measurement device 1, the DUT 10 is irradiated with measurement light and stimulus light subjected to intensity modulation due to a plurality of frequencies, and the intensity of reflected light from the DUT 10 or transmitted light through the DUT 10 is detected. As a result, image data indicating a distribution of lifetimes of carriers is generated on the basis of an output detection signal. At this time, a phase delay of a detection signal with respect to a modulation signal including a frequency in association with a concentration of impurities in a measurement target region of the DUT 10 is detected, and a distribution of lifetimes of carriers is measured on the basis of the phase delay. In this manner, even when the concentration of impurities in the measurement target region changes in a variety of ways, it is possible to accurately measure the distribution of lifetimes of carriers.

In addition, in the irradiation step of the carrier lifetime measurement method of the present embodiment, irradiation is performed with stimulus light having an energy higher than a band-gap energy of a semiconductor configuring the DUT 10. In this manner, carriers can be generated efficiently in the DUT 10 due to irradiation with stimulus light, and a distribution of lifetimes of carriers can be measured more accurately.

In addition, in the irradiation step of the carrier lifetime measurement method, irradiation is performed with stimulus light subjected to intensity modulation using rectangular waves. In this case, the frequency of intensity modulation of stimulus light for measuring a phase delay can be set efficiently. As a result, even when the concentration of impurities changes in a variety of ways, it is possible to efficiently measure the distribution of lifetimes of carriers.

Moreover, in the carrier lifetime measurement method, a region including a defective part in a measurement target object is identified in advance, and measurement is performed targeting the region. In this manner, it is possible to narrow a defective part in advance and to efficiently measure the distribution of lifetimes of carriers at the place. As a result, a defective part in the DUT 10 is easily analyzed.

In addition, in the irradiation step of the carrier lifetime measurement method, irradiation is performed repetitively with stimulus light subjected to intensity modulation for each of a plurality of default frequencies, and in the outputting step, a detection signal is output in association with each ray of the stimulus light. In this case, even when the concentration of impurities changes extensively, it is possible to set a frequency of stimulus light causing a phase delay associated therewith. As a result, even when the concentration of impurities changes extensively, it is possible to accurately measure a lifetime of carriers.

Hereinabove, various embodiments of the present invention have been described. However, the present invention is not limited to the foregoing embodiments and may be modified or may be applied to other configurations within a range which does not change the gist described in each of the claims.

In the generation step of the carrier lifetime measurement method in the foregoing embodiment, a phase delay detected in the frequency in association with the concentration of impurities at the measurement points is identified by extracting a frequency at which the phase delay is close to a predetermined value on the basis of association data obtained by measuring reflected light at a plurality of modulation frequencies, but the configuration is not limited to such a method.

That is, in the generation step, a phase delay detected in the frequency in association with the concentration of impurities indicated by the information may be extracted from the association data on the basis of information of the concentration of impurities related to the measurement target region input to the controller 37 in advance via the input/output device or the like. At this time, the controller 37 may perform control so that a phase delay is detected and output in only the frequency in association with the concentration of impurities by controlling the network analyzer 35. Further, the lifetime of carriers may be computed on the basis of the frequency in association with the concentration of impurities and the extracted phase delay.

According to such a configuration, it is possible to suitably set a frequency of a phase delay detected so as to compute a lifetime of carriers. As a result, it is possible to efficiently measure the distribution of lifetimes of carriers.

The light irradiation/light guiding system 5 of the foregoing embodiment is configured to be able to guide reflected light from the DUT 10 toward the control system 7 but may be configured to be able to guide transmitted light generated when measurement light is transmitted through the DUT 10 toward the control system 7. In this case, a lifetime of carriers is measured on the basis of the detection signal generated by detecting transmitted light in the control system 7.

The light irradiation/light guiding system 5 of the foregoing embodiment may include a fiber coupler as an element for synthesizing measurement light and stimulus light in place of the dichroic mirror 13 or may include fibers having a plurality of cores.

In the light irradiation/light guiding system 5 of the foregoing embodiment, the polarization beam splitter 15 may be disposed between the dichroic mirror 13 and the light source 9a. In this case, the dichroic mirror 13 plays a role of the optical filter 25.

The light irradiation/light guiding system 5 of the foregoing embodiment is configured so that the optical axes and the focal points coincide with each other between measurement light and stimulus light. However, if spots of stimulus light at the measurement points in the DUT 10 include spots of measurement light, the focal points do not necessarily coincide with each other. In addition, when fibers having a plurality of cores are used, the optical axes may be set in a misaligned manner between measurement light and stimulus light.

In addition, in the foregoing embodiment, if the photo detector 29 is configured to be sensitive to only measurement light, the optical filter 25 may be omitted.

In addition, in the foregoing embodiment, measurement is performed using stimulus light subjected to intensity modulation due to rectangular waves. However, a plurality of rays of stimulus light which are subjected to intensity modulation using a signal having a different waveform such as sine waves and which are associated with a plurality of respective frequencies may be used.

In the foregoing embodiment, it is also favorable, in the irradiation step, that irradiation be performed with stimulus light subjected to intensity modulation due to rectangular waves. In addition, it is also favorable that the modulation unit perform intensity modulation of stimulus light using rectangular waves. In this case, it is possible to efficiently set a frequency of intensity modulation of stimulus light for measuring a phase delay. As a result, even when the concentration of impurities changes in a variety of ways, it is possible to efficiently measure the distribution of lifetimes of carriers.

In addition, it is also favorable, in the irradiation step, that irradiation be performed with stimulus light subjected to intensity modulation for each of a plurality of default frequencies and in the outputting step, a detection signal be output in association with each ray of the stimulus light. In addition, it is also favorable that the second light source generate stimulus light subjected to intensity modulation by the modulation unit for each of a plurality of default frequencies and the photo detector output a detection signal in association with each ray of the stimulus light. In this case, even when the concentration of impurities changes extensively, it is possible to set a frequency of stimulus light causing a phase delay in association therewith. As a result, even when the concentration of impurities changes extensively, it is possible to accurately measure a lifetime of carriers.

Moreover, it is also favorable that the foregoing embodiment further include an identifying step of identifying a region including a defective part in a measurement target object in advance so that the region is irradiated with reflected light and stimulus light in the irradiation step and a detection signal is output targeting the region in the outputting step. In this manner, it is possible to narrow a defective part in advance and to efficiently measure the distribution of lifetimes of carriers at the place. As a result, a defective part in a measurement target object is easily analyzed.

Furthermore, it is also favorable, in the generation step, that a phase delay with respect to a modulation signal including a frequency associated with information of a concentration of impurities input in advance be detected. Furthermore, it is also favorable that the analysis unit detect a phase delay with respect to a modulation signal including a frequency associated with information of a concentration of impurities input in advance. When such a configuration is employed, it is possible to simply set a frequency of a phase delay detected for computing a lifetime of carriers. As a result, it is possible to efficiently measure a distribution of lifetimes of carriers.

In addition, it is favorable, in the irradiation step, that irradiation be performed with stimulus light having an energy higher than a band-gap energy of a measurement target object. In another embodiment described above, it is favorable that the second light source generate stimulus light having an energy higher than a band-gap energy of a measurement target object. In this case, carriers can be generated efficiently in a measurement target object due to irradiation with stimulus light, and a distribution of lifetimes of carriers can be measured more accurately.

INDUSTRIAL APPLICABILITY

An embodiment is used for a carrier lifetime measurement method and a carrier lifetime measurement device for measuring a lifetime of carriers in a measurement target object, and it is possible to accurately measure a lifetime of carriers in a measurement target object.

REFERENCE SIGNS LIST

1 Carrier lifetime measurement device
5 Light irradiation/light guiding system (optical system)
7 Control system
9a Light source (first light source)
9b Light source (second light source)
29 Photo-detector
33 Modulation signal source (modulation unit)

35 Network analyzer (analysis unit)
37 Controller (analysis unit)

The invention claimed is:

1. A carrier lifetime measurement method for measuring a lifetime of carriers in a measurement target object, the carrier lifetime measurement method comprising:

irradiating the measurement target object with measurement light and stimulus light subjected to intensity modulation using a plurality of frequencies;

outputting a detection signal by detecting an intensity of reflected light from the measurement target object or transmitted light through the measurement target object; and detecting a phase delay of the detection signal with respect to a modulation signal including a frequency in association with a concentration of impurities in a measurement target region of the plurality of frequencies and generating image data indicating a distribution of lifetimes of carriers in the measurement target object on the basis of the phase delay.

2. The carrier lifetime measurement method according to claim 1, wherein irradiation is performed with the stimulus light subjected to intensity modulation using rectangular waves.

3. The carrier lifetime measurement method according to claim 1, wherein irradiation is performed with the stimulus light subjected to intensity modulation for each of a plurality of default frequencies, and wherein the detection signal associated with each ray of the stimulus light is output.

4. The carrier lifetime measurement method according to claim 1, further comprising:

identifying a region including a defective part in the measurement target object in advance, wherein the region is irradiated with the measurement light and the stimulus light, and wherein the detection signal is output targeting the region.

5. The carrier lifetime measurement method according to claim 1, wherein the phase delay with respect to a modulation signal including a frequency associated with information of a concentration of impurities input in advance is detected.

6. The carrier lifetime measurement method according to claim 1, wherein irradiation is performed with stimulus light having an energy higher than a band-gap energy of the measurement target object.

7. The carrier lifetime measurement method according to claim 1, wherein the measurement target object is a semiconductor device.

8. A carrier lifetime measurement device for measuring a lifetime of carriers in a measurement target object, the carrier lifetime measurement device comprising:

a first light source configured to generate measurement light;

a second light source configured to generate stimulus light;

a modulator configured to perform intensity modulation of the stimulus light using a plurality of frequencies;

a photo detector configured to output a detection signal by detecting an intensity of reflected light from the measurement target object or transmitted light through the measurement target object;

an optical system configured to guide the measurement light and the stimulus light subjected to intensity modulation toward the measurement target object and to guide reflected light from the measurement target object or transmitted light through the measurement target object toward the photo detector; and an analyzer configured to detect a phase delay of the detection signal with respect to a modulation signal including a frequency in association with a concentration of impurities in a measurement target region of the plurality of frequencies, and to generate image data indicating a distribution of lifetimes of carriers in the measurement target object on the basis of the phase delay.

9. The carrier lifetime measurement device according to claim 8, wherein the modulator performs intensity modulation of the stimulus light using rectangular waves.

10. The carrier lifetime measurement device according to claim 8, wherein the second light source generates the stimulus light subjected to intensity modulation for each of a plurality of default frequencies by the modulator, and wherein the photo detector outputs the detection signal in association with each ray of the stimulus light.

11. The carrier lifetime measurement device according to claim 8, wherein the analyzer detects the phase delay with respect to a modulation signal including a frequency associated with information of a concentration of impurities input in advance.

12. The carrier lifetime measurement device according to claim 8, wherein the second light source performs irradiation with stimulus light having an energy higher than a band-gap energy of the measurement target object.

* * * * *